(12) United States Patent
Candler et al.

(10) Patent No.: US 11,270,892 B2
(45) Date of Patent: Mar. 8, 2022

(54) MULTILAYER BATCH MICROFABRICATED MAGNETIC SHIELDING

(71) Applicant: THE REGENTS OF THE UNIVERSITY OF CALIFORNIA, Oakland, CA (US)

(72) Inventors: Robert N. Candler, Los Angeles, CA (US); Jimmy Chen-Yen Wu, Los Angeles, CA (US); Ling Li, Los Angeles, CA (US); Jere C. Harrison, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/264,979

(22) Filed: Feb. 1, 2019

(65) Prior Publication Data

US 2019/0244831 A1 Aug. 8, 2019

Related U.S. Application Data

(60) Provisional application No. 62/625,694, filed on Feb. 2, 2018.

(51) Int. Cl.
| | |
|---|---|
| *H01L 21/3213* | (2006.01) |
| *H01L 21/768* | (2006.01) |
| *H01L 43/12* | (2006.01) |
| *H01L 23/552* | (2006.01) |

(52) U.S. Cl.
CPC .... *H01L 21/3213* (2013.01); *H01L 21/76898* (2013.01); *H01L 23/552* (2013.01); *H01L 43/12* (2013.01)

(58) Field of Classification Search
CPC ... H01L 21/3213; H01L 23/552; H01L 43/12; H01L 21/76898
See application file for complete search history.

(56) References Cited

U.S. PATENT DOCUMENTS

| | | | |
|---|---|---|---|
| 3,493,760 A | 2/1970 | Hoadley | |
| 3,512,946 A | 5/1970 | Hutkin | |
| 4,647,714 A | 3/1987 | Goto | |
| 5,902,690 A | 5/1999 | Tracy et al. | |
| 6,566,596 B1 | 5/2003 | Askew | |
| 2012/0127612 A1* | 5/2012 | Shin | G11B 5/1278 360/123.12 |
| 2015/0147481 A1* | 5/2015 | Braganca | C25D 5/48 427/529 |

OTHER PUBLICATIONS

"Magnetic Shield Electroplating", Integran Technologies, 2018, retrieved from <http://www.integran.com/services/nanovate-em-magnetic-shield-coating>.

* cited by examiner

*Primary Examiner* — Binh X Tran
*Assistant Examiner* — Mahmoud Dahimene
(74) *Attorney, Agent, or Firm* — Foley & Lardner LLP

(57) ABSTRACT

A microfabrication process includes: (1) etching a shield pattern into a substrate; (2) forming a set of shielding layers on the substrate and in the shield pattern, wherein the shielding layers include n+1 magnetic layers and n spacing layers, n is 0 or an integer that is 1 or greater than 1, and each spacing layer is disposed between a pair of magnetic layers; and (3) planarizing the substrate to expose edges of the shielding layers.

15 Claims, 11 Drawing Sheets

MULTILAYER BATCH MICROFABRICATED MAGNETIC SHIELDING

CROSS-REFERENCE TO RELATED APPLICATION

This application claims the benefit of U.S. Provisional Application No. 62/625,694, filed Feb. 2, 2018, the contents of which are incorporated herein by reference in their entirety.

STATEMENT REGARDING FEDERALLY SPONSORED RESEARCH OR DEVELOPMENT

This invention was made with government support under Grant number N66001-15-1-4074, awarded by the U.S. Department of Defense, Defense Advanced Research Projects Agency. The government has certain rights in the invention.

TECHNICAL FIELD

This disclosure generally relates to magnetic shielding.

BACKGROUND

Comparative magnetic shields are typically machined single or multilayer structures, resulting in costly and bulky shields best suited for macroscale enclosures.

It is against this background that a need arose to develop the embodiments described herein.

SUMMARY

In some embodiments, a microfabrication process includes: (1) etching a shield pattern into a substrate; (2) forming a set of shielding layers on the substrate and in the shield pattern, wherein the shielding layers include n+1 magnetic layers and n spacing layers, n is 0 or an integer that is 1 or greater than 1, and each spacing layer is disposed between a pair of magnetic layers; and (3) planarizing the substrate to expose edges of the shielding layers.

In additional embodiments, a shielded device includes: (1) a shielded enclosure including a first portion and a second portion, wherein the first portion of the shielded enclosure includes a first substrate defining a first trench, and a first set of shielding layers in the first trench, and wherein the second portion of the shielded enclosure is bonded to the first portion of the shielded enclosure, and the second portion of the shielded enclosure includes a second substrate defining a second trench, and a second set of shielding layers in the second trench; and (2) a device disposed between the first portion and the second portion of the shielded enclosure, and enclosed by the first set of shielding layers and the second set of shielding layers.

In further embodiments, a fabrication process includes: (1) providing a structure including a device and having a non-planar surface; and (2) forming a plurality of shielding layers on the non-planar surface, wherein the shielding layers include n+1 magnetic layers and n spacing layers, n is an integer that is 1 or greater than 1, and each spacing layer is disposed between a pair of magnetic layers.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Embodiments of this disclosure are directed to microfabrication techniques to form magnetic shields, simultaneously pushing the constraints of attainable minimum size, maximum shielding factor, flexibility, and cost.

In some embodiments, a microfabrication process includes alternating and automated electrodeposition between baths of a magnetic material (e.g., Permalloy) and a spacing material (e.g., copper) for batch microfabrication of microscale shielding layers, reducing time and cost through parallelism. Microfabrication provides flexibility in shield thickness and shape design to avoid saturation and allows sophisticated interconnect formation for an enclosed device, such as snaked interconnects, to reduce the effect of feedholes or pinholes on a shielding factor. Furthermore, a lamination size scale facilitates component integration of a die with other system components, leading to true chip-scale shielded systems.

Figure 1:
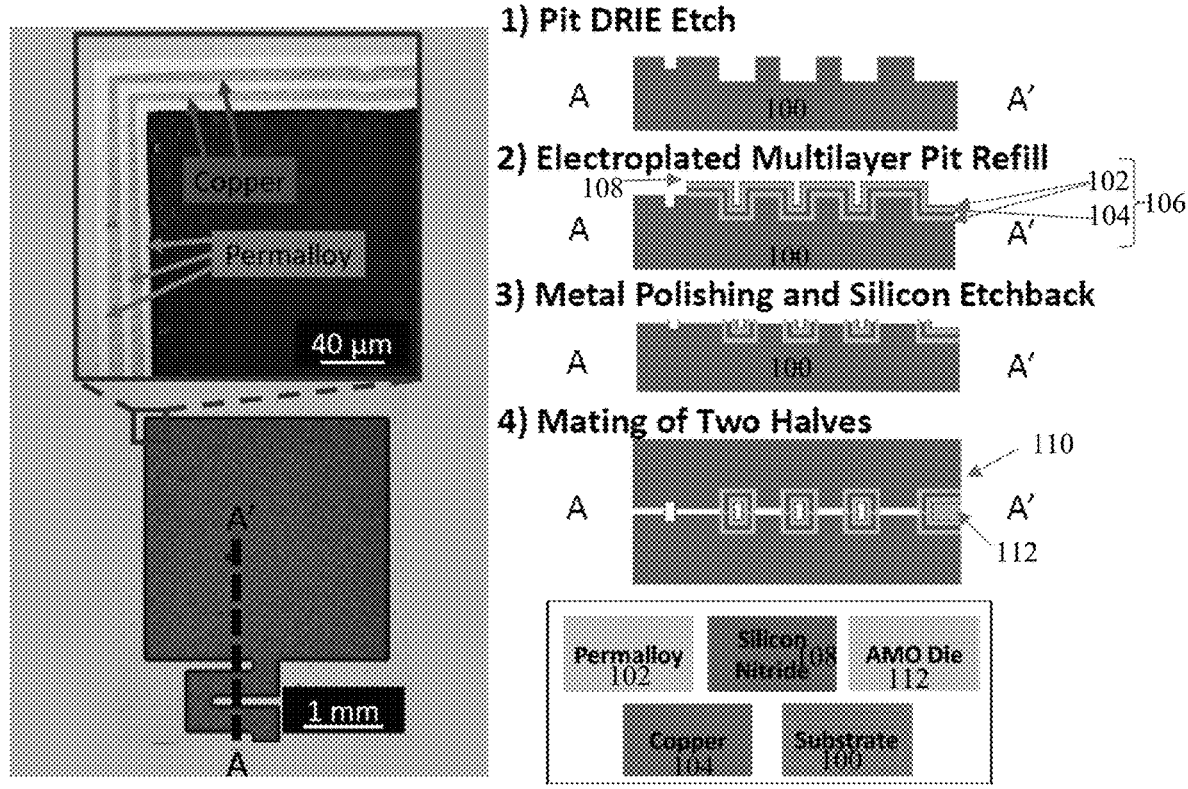
FIG. 1: Batch microfabrication process of a shielded device of some embodiments.

FIG. 1 illustrates a batch microfabrication process of a shielded device of some embodiments. First, a shield pattern is lithographically defined and etched into a substrate 100, which will serve as a shape of half of an enclosure. The substrate 100 can be a silicon wafer (or another semiconductor substrate), a printed circuit board, or another etchable substrate, and lithographical patterning can be performed by a subtractive process such as reactive ion etching that can form trenches, depressions, or pits in the substrate 100. Multiple shield patterns can be defined and etched into the substrate 100, to reduce time and cost through parallelism. In some embodiments, a trench associated with each shield pattern can be a single, continuous trench including a first portion to accommodate shielding layers to be deposited in the first portion, and a second portion to accommodate an electrical interconnect to be deposited in the second portion. The shielding layers and the electrical interconnect can be deposited concurrently. The second portion is also shielded and is sized to accommodate the interconnect to a device that will be enclosed in the shield pattern. The second portion can have a nonlinear shape, such as a snaked or zigzag shape, such that the resulting electrical interconnect takes on the nonlinear shape to mitigate leaking of magnetic fields caused by pinholes in the shielding layers. For example, the second portion can include multiple sections, where a first section extends along a first direction parallel to a major surface of the substrate 100, a second section extends along a second direction parallel to the major surface of the substrate 100 and the second direction forms an angle with the first direction in a range of about 30° to about 90°, a third section extends along a third direction parallel to the major surface of the substrate 100 and the third direction forms an angle with the second direction in a range of about 30° to about 90°, and so forth.

Next, an electroforming seed layer is deposited to form a conductive surface on the substrate 100 and in the shield pattern. The seed layer can include a metal, a metal alloy, or other conductive material. Magnetic layers 102 and spacing layers 104 are then sequentially formed by electrodeposition to yield shielding layers 106 on the substrate 100 and in the shield pattern, followed by an insulating layer 108 to cover at least a portion of the shielding layers 106 and isolate the shielding layers 106 from contained device interconnects. In some embodiments, the shielding layers 106 include n+1 magnetic layers 102 and n spacing layers 104, where n is 0 or an integer that is 1 or greater than 1, such as 2 or greater, 3 or greater, 4 or greater, or 5 or greater, and each spacing layer 104 is disposed between a pair of magnetic layers 102. The magnetic layers 102 can include a magnetic material having a sufficiently high permeability to redirect flux lines for shielding relative to a contained device, such as a maximum relative permeability pr of at least about 100, at least about 500, at least about 1000, at least about 5000, or at least about 8000. Examples of suitable magnetic materials include nickel-iron alloys, such as Permalloy, and mu-metals. The spacing layers 104 can include a metal, such as copper, a metal alloy, or other conductive material, or another material having a low permeability, relative to the magnetic layers 102. The spacing layers 104 can be conductive layers, which provide electromagnetic interference (EMI) and radio frequency (RF) shielding beyond direct current (DC) magnetic shielding. The insulating layer 108 can include an oxide or a nitride, such as silicon nitride, or other insulating material. A thickness of each magnetic layer 102 can be in a range of about 1 µm to about 100 µm or more (depending on the ability of the substrate 100 to handle stress of deposited layers), about 1 µm to about 50 µm, about 1 µm to about 20 µm, or about 10 µm, a thickness of each spacing layer 104 can be in a range of about 1 µm to about 100 µm, about 1 µm to about 50 µm, about 1 µm to about 20 µm, or about 10 µm, and a thickness of the insulating layer 108 can be in a range of about 0.1 µm to about 10 µm, about 0.5 µm to about 5 µm, about 0.5 µm to about 2 µm, or about 1 µm.

Next, the substrate 100 is planarized or polished by chemical mechanical polishing to expose edges of the shielding layers 106, thereby forming half of a shielded enclosure 110. Another half of the shielded enclosure 110 can be formed in parallel in a similar manner—in another part of the same substrate 100 followed by singulation to yield the two halves, or in another substrate (e.g., a second substrate). The two halves are aligned and bonded together, with exposed edges of the shielding layers 106 of one half facing and connected to exposed edges of the shielding layers 106 of another half. The shielding layers 106 of one half of the shielded enclosure 110 and the shielding layers 106 of another half of the shielded enclosure 110 can define a space in between to accommodate a device 112, such as a die, and the device 112 can be positioned between the two halves when bonding the two halves together. Bonding can be performed in a number of ways, such as with a curable polymer or by metal bonding. Alignment can be performed via infrared cameras or optical cameras and alignment marks.

In some embodiments, electrodeposition of the magnetic layers 102 and the spacing layers 104 is performed using a robotic plater, which can be implemented as a plastic pneumatic wafer robot to rapidly alternate between two plating baths. The wafer robot can be implemented using environmentally resistant pneumatic cylinders and a Michelson interferometer for movement feedback using light diffraction. Each plating cell includes an about 4 to 6 inch wafer chuck, an agitator assembly, an anode cell assembly, and a respective anode for plating. Each plating cell and the respective anode are connected to a continuous filtration system while being pH monitored with progress being measured by a reference electrode.

Figure 2:
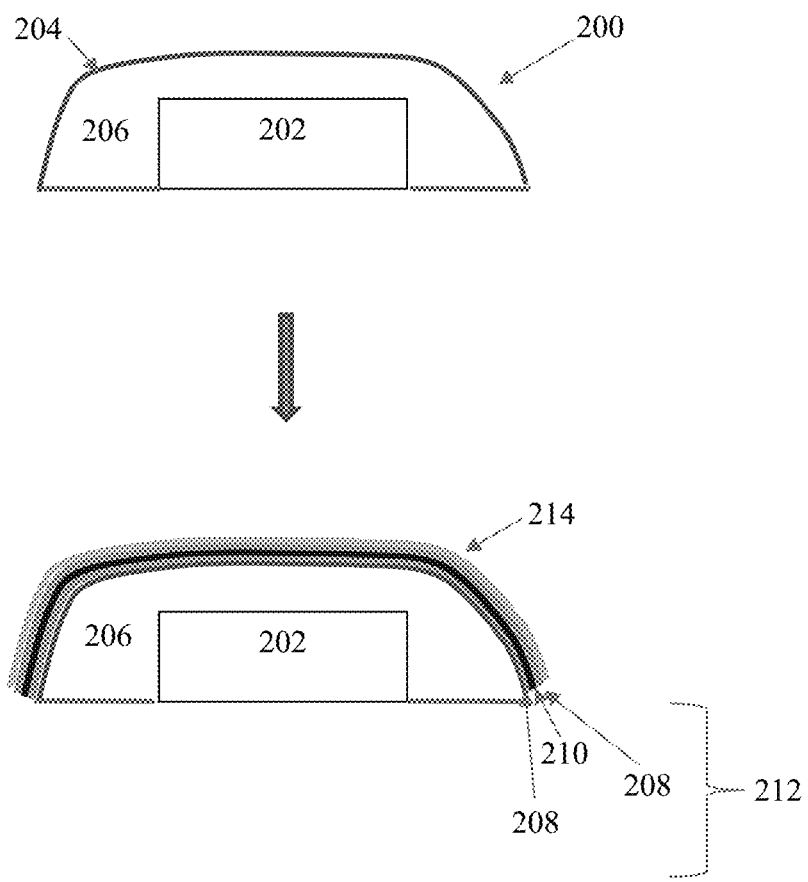
FIG. 2: Fabrication process of a shielded device of additional embodiments.

Additional embodiments of this disclosure are directed to techniques to form microscale, conformal, multilayer shields over structures (e.g., pre-formed structures) having arbitrary shapes, such as non-planar shapes. As illustrated in FIG. 2 of some embodiments, a fabrication process of a shielded device includes providing a structure 200 including a device 202 and having a non-planar surface 204. The structure 200 can be provided by forming a mold 206 covering or encapsulating the device 202, where the non-planar surface 204 is a surface of the mold 206, and the mold 206 includes a polymer or another suitable encapsulant material. Next, an electroforming seed layer is deposited on the non-planar surface 204. The seed layer can include a metal, a metal alloy, or other conductive material. Magnetic layers 208 and spacing layers 210 are then sequentially formed by electrodeposition to yield shielding layers 212 on the non-planar surface 204, followed by an insulating layer 214 to cover at least a portion of the shielding layers 212 and isolate the shielding layers 212. In some embodiments, the shielding layers 212 include n+1 magnetic layers 208 and n spacing layers 210, where n is an integer that is 1 or greater than 1, such as 2 or greater, 3 or greater, 4 or greater, or 5 or greater, and each spacing layer 210 is disposed between a pair of magnetic layers 208. Certain aspects of the magnetic layers 208, spacing layers 210, and the insulating layer 214 can be similarly implemented as discussed above for a microfabrication process of FIG. 1, and repetition of those aspects is omitted.

Microscale shielding specifies the development of a technique to characterize a shielding factor. This provides a challenge to microscale magnetometry. A solenoidal fluxgate magnetometer fabricated using multiple thick-film electroplating operations can be integrated within the shielded enclosure to provide measurements of flux density within the shielded enclosure. Magnetometers can be calibrated using solenoidal or planar fabricated coils within the shielded enclosure to mitigate against drift over time.

Compact electromagnetic shielding can pave the way for improved high precision systems, such as for atomic, molecular, and optical (AMO) microsystems, where long term stability of atomic sensors is desirable for timing and navigation. Recent advances in atom traps and atomic interferometry have led to chip-scale atomic clocks, but further miniaturization is hindered by stray fields of other systems that introduce noise detrimental to performance. Microfabricated shields allow compact integration of magnetic traps with related circuitry and components, allowing smaller overall package sizes, reducing manufacturing costs through batch fabrication, and improving precision with high field suppression. Microfabricated shields allow implementation of a single package integration of clocks and inertial sensors for a self-contained navigation system, autonomous of external communication and impervious to disruptive mechanisms.

While providing shielding to electrically controlled devices, it is also desired to extract interconnects with reduced time and cost. Furthermore, pinholes for extraction can yield a lower shielding factor in various directions, affecting device performance. Microfabricated multilayer shields can be customized to fit a design geometry and electrical interconnects while implementing snaked designs to reduce the effect of pinholes. This integrated technique omits manual threading of wires through offset shield holes as is performed with some comparative magnetic shields. This technique can be extended to form optical interconnects, in which a plated pathway acts as a waveguide for optical signals to weave through a shield to interact with a device.

With respect to AMO microsystems, batch microfabricated magnetic shields also can be used for shielding vapor cells, vacuum pumps, and laser systems. Other applications of batch microfabricated magnetic shields include a range of magnetic devices following the trends of miniaturization and compact integration. For example, solutions for haptic actuators, such as eccentric rotating mass motors and linear resonant actuators, use large magnets; thus, scaling these components down and integrating them in smaller systems will benefit from improved magnetic shielding to reduce magnetic interference between various components. Furthermore, a magnetoresistve random-access memory includes magnetic tunnel junctions which are sensitive to magnetic cross-talk and background noise. The junctions themselves are typically hundreds of nanometers large, making microfabricated shielding a desired solution for compact integration.

Additional applications include consumer electronics where components that generate magnetic fields are placed in close proximity to components that are sensitive to magnetic fields. As one example, many smart phones include permanent magnets, which can interfere with magnetometers in the phones, which are used to provide a compass feature. Thus, magnetometers can benefit from shielding of some embodiments of this disclosure. Further applications include dual purpose shields, which shield both DC magnetic fields and electromagnetic waves. Because conductive layers are used between magnetic layers in multilayer shields of some embodiments, shielding is also attained against electromagnetic (namely, not DC) interference.

Example

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Micro- to Millimeter Scale Magnetic Shielding

Overview:

This example presents two results related to magnetic shielding. First, milliscale single layer magnetic shields were fabricated on 3D printed polymer molds to achieve shielding factors in excess of about 4500. Second, microscale multilayer shields of alternating about 10 μm layers of Permalloy and copper were microfabricated onto silicon using batch fabrication processes and characterized. While comparative electromagnetic interference (EMI) shielding includes a conductor for shielding by image charges, direct current (DC) magnetic shielding specifies a high permeability material to provide a low reluctance path, redirecting magnetic fields around its volume. Leveraging electroplating of thick, high permeability (e.g., maximum $\mu_r$>about 8000) Permalloy over sharp topologies, demonstration is made of two processes of producing conformal electroplated shielding. The size, shape flexibility, and shielding factor of resulting structures allow compact integration of magnetic devices for magnetic microelectronics and atomic, molecular, and optical (AMO) microsystems.

Figure 3:
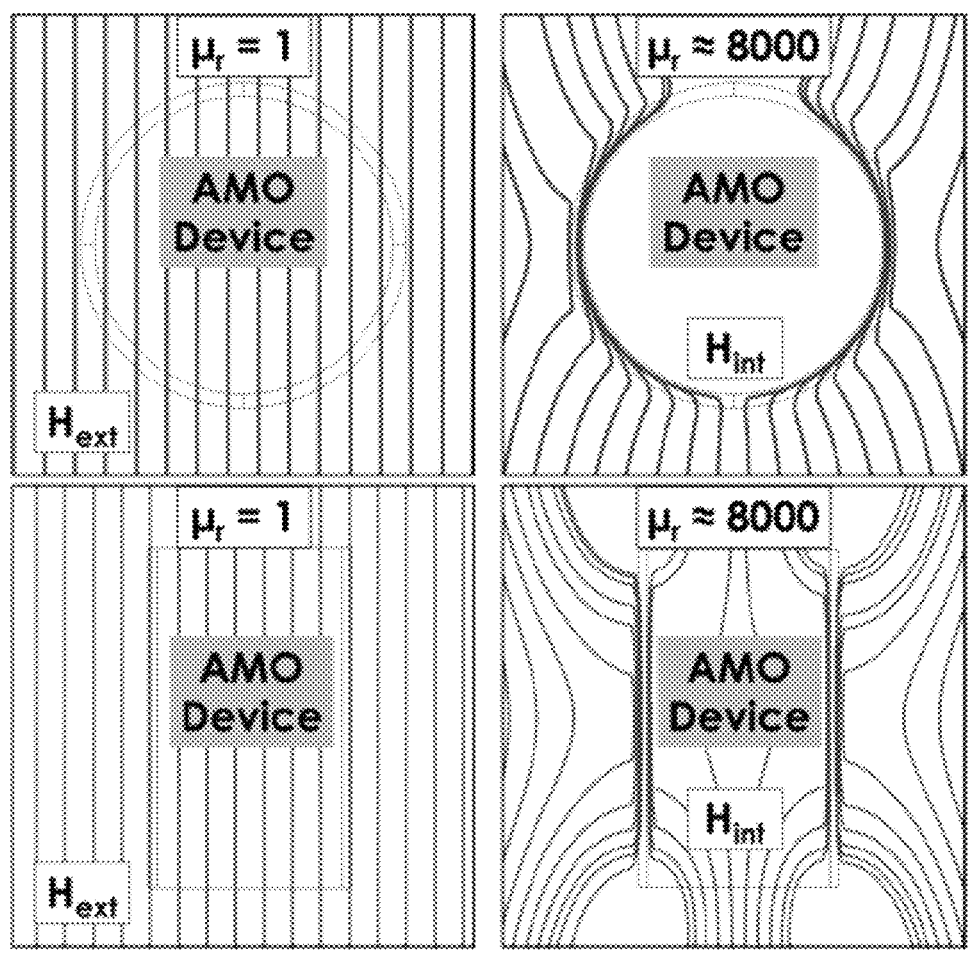
FIG. 3: COMSOL simulation of an 11 millitesla (mT) field applied to a 300 µm cylindrical shell with no lids perpendicular to a cylinder axis (top) and parallel to the cylinder axis (bottom) corresponding to transverse and longitudinal shielding.

Introduction:

Compact magnetic shielding paves the way for a next generation of magnetic systems, such as for AMO technology, where long term stability of atomic sensors is desirable for timing and navigation. Recent advances in AMO devices using atom traps and atomic interferometry have led to chip scale atomic clocks making high precision, atomic-based timing and navigation devices more accessible. However, further miniaturization is constrained by stray microtesla (μT) to millitesla (mT) fields from other systems. These fields and fluctuations affect atomic transition frequencies and interfere with interrogation methods, raising the noise floor and reducing device stability in these high precision devices. Thus, for improved operation, it is desired to enclose the devices in a high permeability material, redirecting the magnetic flux lines and suppressing their parasitic effects (FIG. 3).

Here this example presents two types of electrodeposited shields that allow for the compact integration of magnetic devices including the direct integration of magnetic shielding on a device. Milliscale single layer shields electroplated on 3D printed polymer molds provide high efficiency shielding around arbitrary shapes, and microscale multilayer shields sequentially electroplated on silicon pave the way for the parallelized fabrication of chip-scale shielding. Overall, these shields allow total system miniaturization through conform deposition and scalability through batch fabrication.

Theory:

For a single cylindrical shell with a thickness much smaller than a diameter, the transverse shielding factor can be approximated as $$S_i = \frac{H_{ext}}{H_{int}} = \left(\frac{\mu_i t_i}{D_i}\right) \quad (1)$$

where $H_{ext}$ is the externally applied field, $H_{int}$ is the field within the shield, $\mu_i$ is the magnetic permeability, $t_i$ is the layer thickness, and $D_i$ is the shell diameter. For other geometries, the shielding factor can be expressed analytically by changing the constant shape factor. For a general concentric shield with n layers, the total shielding factor can be written as $$S = \Sigma_{k=0}^n P_k \quad (2a)$$

$$P_0 = 1 \quad (2b)$$

$$P_1 = S_1 + S_2 + \ldots + S_n, \quad (2c)$$

$$P_n = S_1 d_{12} S_2 d_{23} \ldots S_{n-1} d_{n-1} S_n, \quad (2d)$$

where $d_{ij}$ is the normalized difference in volume between consecutive shields while indexing outwards. The first polynomial $P_1$ is the intuitive sum of the individual shielding factors, but the higher order polynomials show that the total shielding factor scales multiplicatively with the number of layers, provided that individual shielding factors are high when compared to their associated $d_{ij}$ parameters. Stated in another way, a large number of thin shields can provide a much higher shielding factor than a single shield with the same total material thickness.

Figure 4:
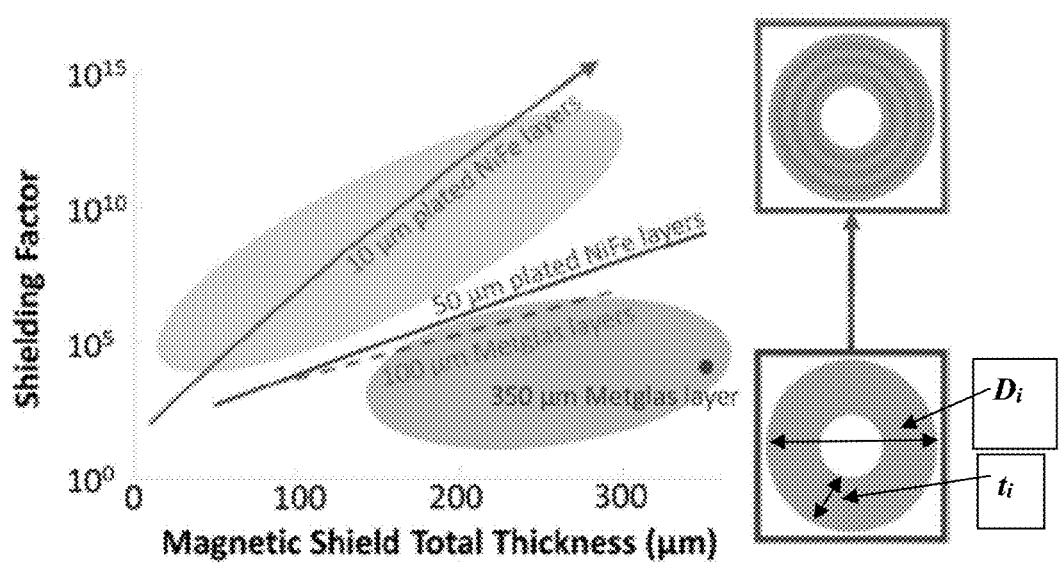
FIG. 4: Spherical plated shielding layers of varying thickness are plotted (top area). Theoretical Metglas layers of about 100 µm and a physically demonstrated shielding layer of about 350 µm are plotted for comparison (bottom area). The plot depicts a substantially constant 1 mm diameter shield with varying total shielding thickness.

FIG. 4 demonstrates the scaling of microelectromechanical system (MEMS)-scale multilayer shields compared to comparative approaches, such as with thick Metglas or other mu-metals (nickel-iron magnetic alloys), using the shielding factor equation shown. A vast increase in shielding factor by several orders of magnitude is observed by increasing the number of shields within a constant total thickness. Shielding factor gain begins to level off, as individual shielding factors degrade with more layers as the shields can be too weak given the inner diameter. Thus, optimal shielding factor can be attained by tailoring the thickness and spacing of thin shield layers for a given field to operate at the edge of saturation, providing the highest shielding factor with the most compact shield. This process is challenging for machining yet attainable using the batch fabrication methods demonstrated in this example.

Experimental Detail:

Milliscale Shielding Fabrication

A process was demonstrated to produce conformal magnetic shielding around arbitrary geometries using electroplating of thick, high permeability (maximum $\mu_r$>about 8000) Permalloy ($Ni_{80}Fe_{20}$) over various topologies. First, hollow cylindrical molds with about 12 mm length and about 6.5 mm diameter were printed using a photocurable polymer. An electroforming seed was deposited on the polymer by RF sputtering (Denton Discovery). The seed layer was composed of about 300 nm copper (Cu) to carry the electroplating current and about 50 nm titanium (Ti) as a cap. Prior to electrodeposition, the exposed Ti was immersed in about 1% hydrofluoric acid (HF), and an about 300 μm thick layer of a Permalloy shielding was plated by modifying a process detailed by Glickman et al., "High permeability Permalloy for MEMS," Proc. Hilton Head. 2010, the content of which is incorporated herein by reference. Codeposition of the alloy is done at a precise ratio as moderate changes in alloy composition can lead to deviations in permeability, saturation, and coercivity. Thus, to maintain uniform electroplating conditions, the sample orientation was rotated about 180° halfway through deposition. Furthermore, a backside set of fins was introduced to allow vigorous agitation of the surfaces facing towards and away from an anode.

Figure 5:
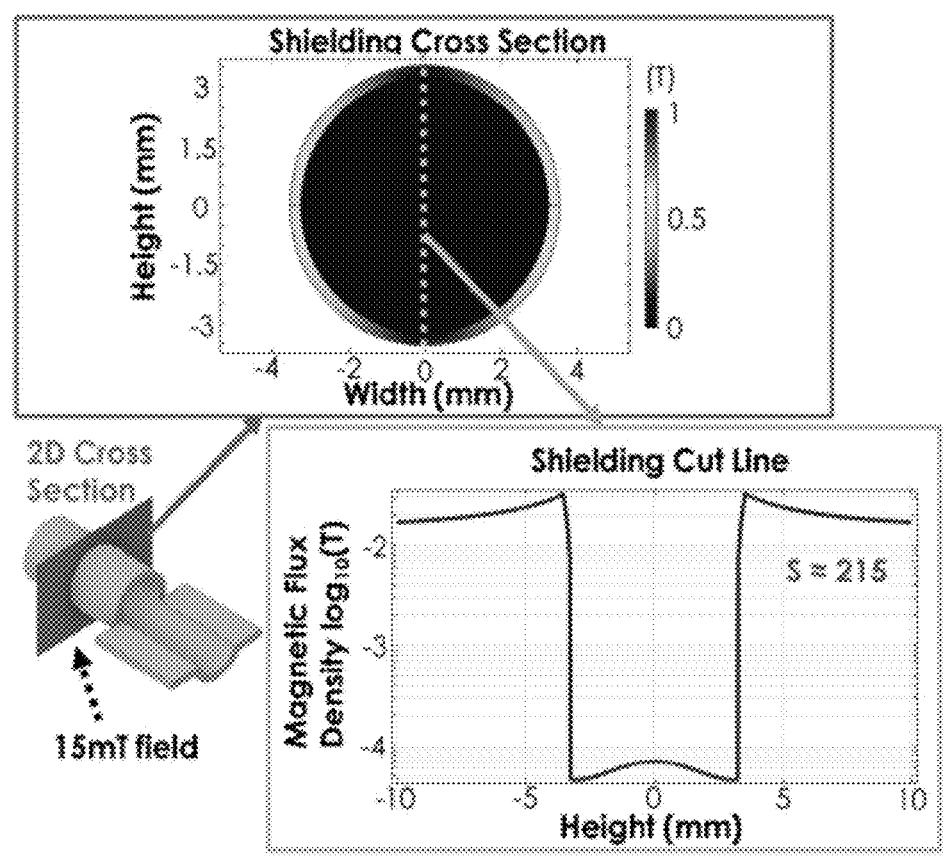
FIG. 5: COMSOL simulation showing the transverse shielding of milliscale shields. The cross section (plane) shows magnetization of the Permalloy, and the cut line shows the external and internal flux density, which are used to calculate the shielding factor.
Figure 9:
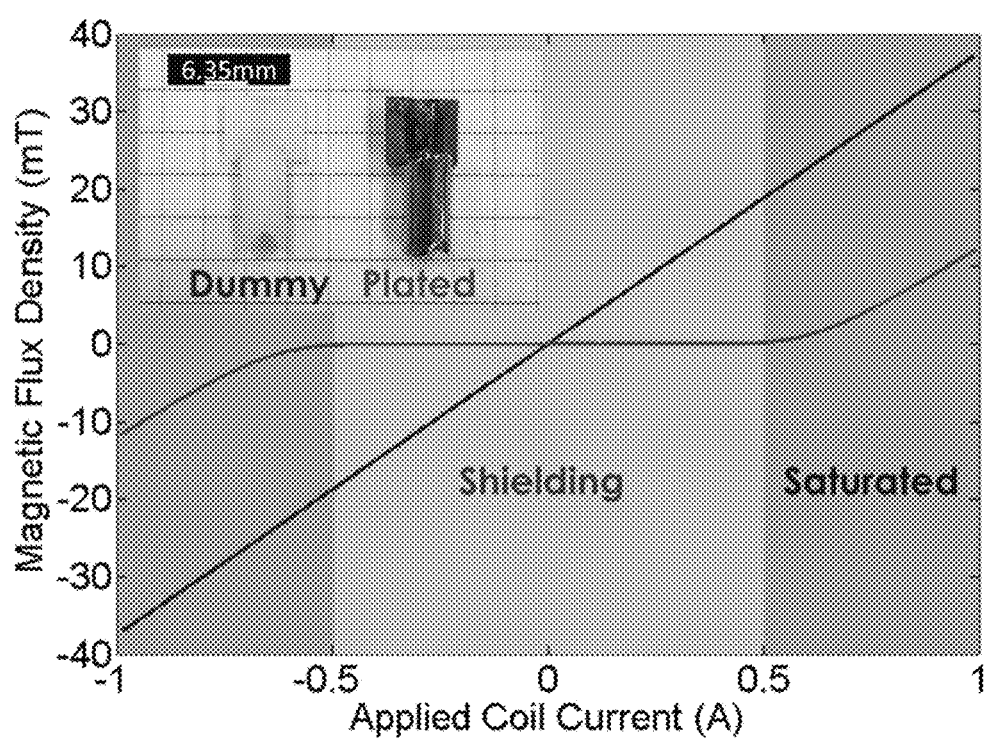
FIG. 9: Measured magnetic flux densities inside an unshielded dummy cylinder (left) and an about 300 µm Permalloy shield (right) are plotted against a current in an electromagnet that was used to generate a magnetic field.

These operations aided in coating the cylindrical polymer molds in a conformal, high permeability magnetic shielding layer. FIG. 5 shows a finite element method simulation of the transverse shielding factor of the milliscale shields as fabricated with about 15 mT applied external field. An inset picture in FIG. 9 shows the unplated and plated milliscale polymer molds.

Milliscale Shielding Characterization

Figure 6:
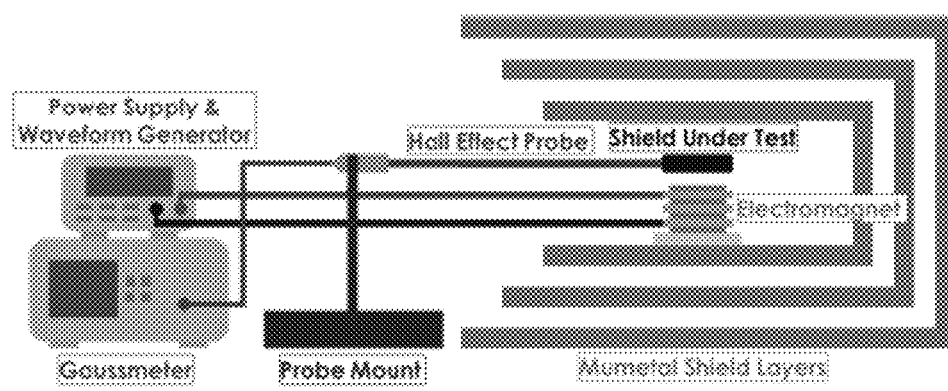
FIG. 6: Diagram of a measurement setup for milliscale shielding factor characterization.

For shielding factor characterization, a magnetic field was applied externally using an iron core electromagnet, which was placed in three concentric cylindrical mu-metal shields to mitigate any magnetic noise (FIG. 6). The applied flux was swept from 0 mT to about 40 mT, then about −40 mT, and then back to 0 mT. The flux densities were measured using a Hall effect probe (FW Bell HTF99-0608) and Gaussmeter (FW Bell Series 9900). Measurements were made while the probe was inserted into an unplated control dummy followed by a plated shielding mold. The transverse shielding factor was calculated as a ratio of the two flux densities.

Microscale Shielding Fabrication

Figure 7:
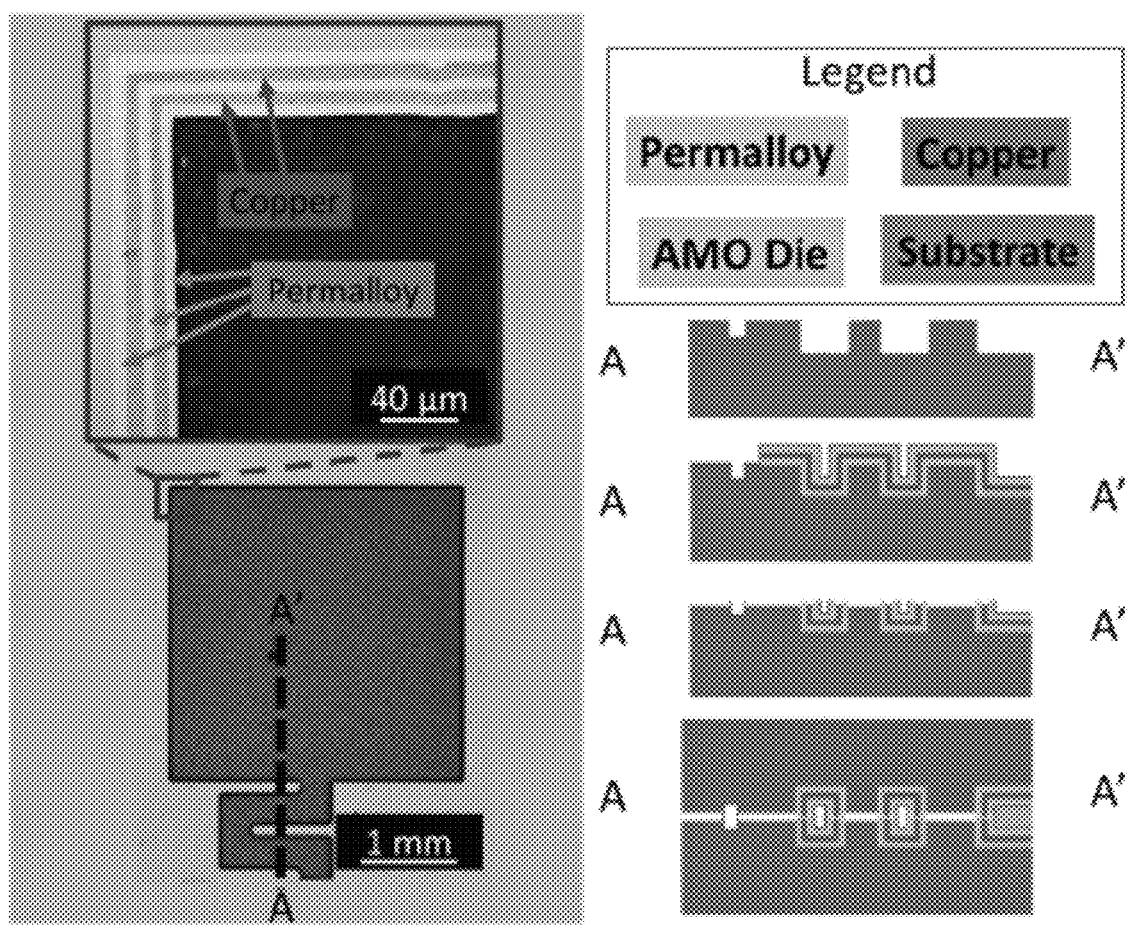
FIG. 7: Microscope image (left) and illustration (right) of a fabrication process for electroplated multilayer magnetic shields encapsulating an atomic, molecular, and optical (AMO) device.

A process for batch fabrication of multilayer magnetic shielding with chip-scale characteristic lengths was also demonstrated using microfabrication techniques (FIG. 7). First, a shield pattern was lithographically defined and etched about 235 μm into a silicon wafer using a deep reactive ion etcher (Plasma-Therm DSE II). This pattern included shield diameters varying from about 1.5 mm to about 6 mm and snaked electrical interconnects to mitigate leaking of magnetic fields through the electrical interconnects. Next, a seed layer and an about 10 μm Permalloy shielding layer were deposited in a similar manner as the milliscale shield fabrication. After an about 1% HF etch to remove native oxide, an about 10 μm Cu film was electroplated onto the wafer from a Cu anode in a sulfate based solution (Technic Elevate 6320) through a polypropylene mesh filter. The Permalloy and Cu depositions were repeated until three about 10 μm layers of Permalloy and two about 10 μm layers of Cu had been plated. An about 1 μm insulating silicon nitride ($Si_3N_4$) film was then deposited by plasma enhanced chemical vapor deposition (STS Multiplex CVD) to isolate the shielding layers from contained device interconnects. Finally, the wafer surface was polished to expose the shield edges via chemical mechanical polishing (Logitech PM5). Each pattern formed half a shield, and two shield halves were manually aligned and bonded together with a heated photoresist (SPR 220-3) to form a completed magnetic flux path.

Microscale Shielding Characterization

Figure 8:
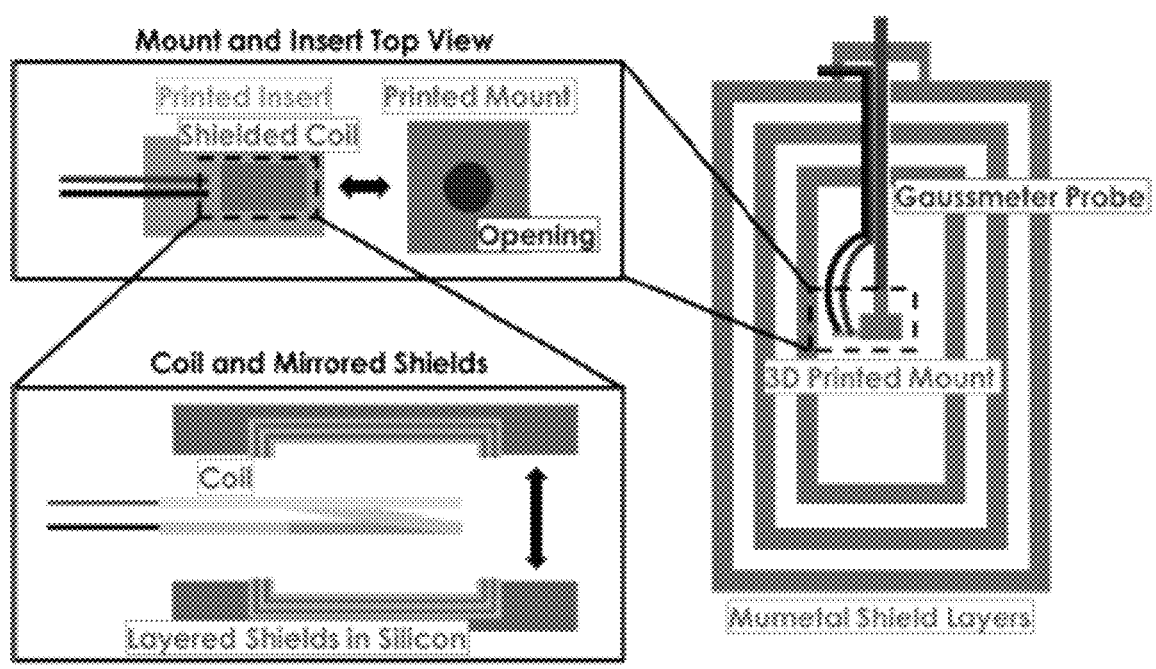
FIG. 8: Diagram of a measurement setup for microscale shielding factor characterization.

Characterization of the chip-scale shielding factors was performed using inductive planar coils fabricated on flexible printed circuit boards (FlexPCB) and placed inside the microfabricated shield halves. The coils were mounted on custom 3D printed fixtures, and this assembly was then inserted into three concentric mu-metal shields (FIG. 8). A Hall effect probe and Gaussmeter measured the magnetic flux density generated by the coils while half encapsulated and fully encapsulated by the microfabricated shields. The longitudinal shielding factor was then calculated as the ratio of the measured flux densities while accounting for inductance variation.

Results:

Milliscale Shielding

Figure 10:
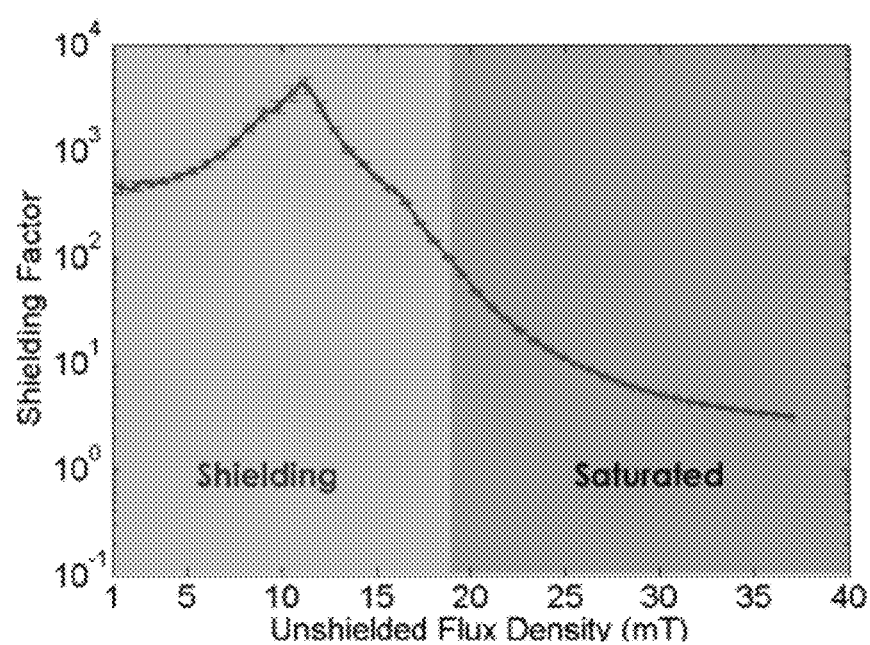
FIG. 10: Measured shielding factor calculated from FIG. 9 is plotted with an unshielded flux density. Error bars are shown from Gaussmeter resolution.

FIG. 9 shows the measured magnetic flux density with the dummy and shielding molds, and the calculated shielding factor is shown in FIG. 10. The shield reduced the field by over two orders of magnitude up until about 19 mT of applied flux density (shielding region), after which saturation of the Permalloy layer lowers permeability and decreases the shielding factor (saturated regions). At higher electromagnet currents, the fully saturated shield was able to redirect a substantially constant 25 mT of flux density, allowing the rest to penetrate to the measurement probe. The highest shielding factor of about 4500 was measured at about 11 mT applied flux density. An issue in high shielding factor measurement is the resolution constraint in measuring shielded flux densities. The accuracy of smaller field characterization was constrained by the about 0.1 µT resolution of the Gaussmeter and finite Hall sensor volume. Thus, the shielding factor appears to lessen with smaller applied flux densities due to sensor constraints.

Microscale Shielding

Figure 11:
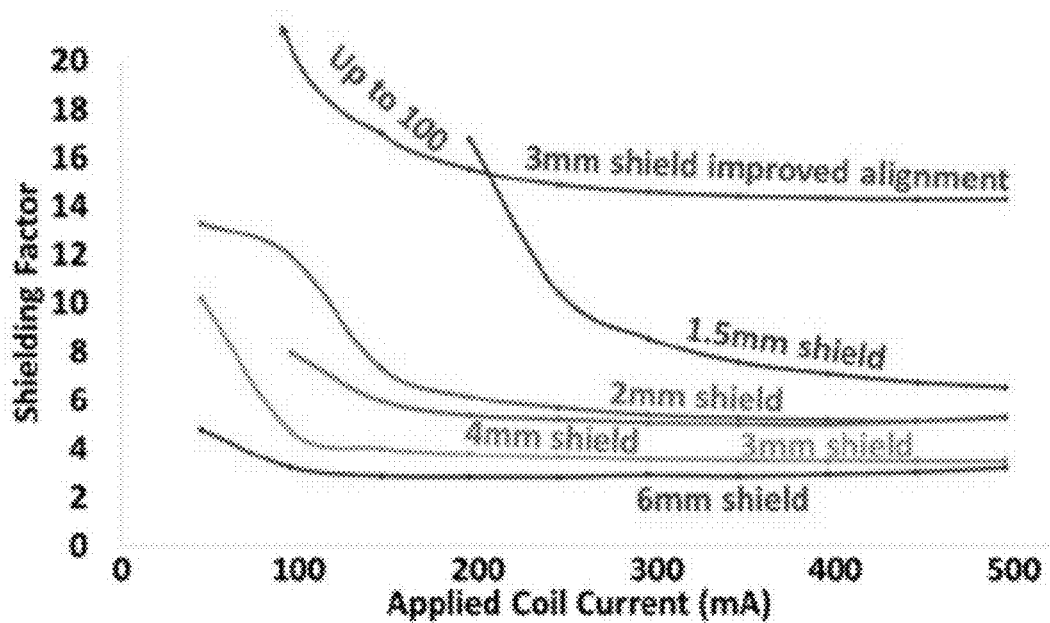
FIG. 11: Measured shielding factor for microfabricated shields with total shielding thickness of about 50 µm and varying inner diameter.

FIG. 11 shows the shielding factors measured from various microfabricated shields with the current applied to the inductive coils. Due to the thickness of the microfabricated shields, the onset of saturation occurred faster and shielding factor was smaller. However, consistent with analytical expressions, the shielding factor mostly improved for smaller versions of microfabricated shields as compared to larger ones due to geometrical factors and delayed saturation. Difficulty in alignment of the about 10 µm shield edges resulted in variations of shielding factor measurements between samples. At about 400 mA applied current, the shielding factor for an about 3 mm shield varied from about 3.5 to about 14.3 depending on alignment. The highest measured shielding factor of about 98 was measured for an about 3 mm diameter shield (top line) at about 55 µT applied internal field.

Conclusion:

In summary, this example has demonstrated micro- to millimeter scale, conformal, compact, and high performance magnetic shielding. The flexibility in shield thickness and shape design, ease of component integration, and scalability through batch fabrication can allow the compact packaging of vapor cells, vacuum pumps, and laser systems in miniaturized AMO platforms including other areas (e.g., non-reciprocal RF devices) where miniaturization brings magnetic sources on-chip.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object provided "on," "over," "on top of," or "below" another object can encompass cases where the former object is directly adjoining (e.g., in physical contact with) the latter object, as well as cases where one or more intervening objects are located between the former object and the latter object.

In the description of some embodiments, a "non-planar" surface can refer to such a surface in which a difference between a highest point and a lowest point of the surface is at least 1 µm, at least 5 µm, or at least 10 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A microfabrication process comprising:
   etching a shield pattern into a substrate;
   forming a set of shielding layers on the substrate and in the shield pattern, wherein the shielding layers include n+1 magnetic layers and n spacing layers, n is an integer that is 1 or greater than 1, and each spacing layer is disposed between a pair of magnetic layers;
   planarizing the substrate to expose edges of the shielding layers, wherein the substrate is a first substrate, the set of shielding layers is a first set of shielding layers, and wherein planarizing the first substrate yields a first portion of a shielded enclosure;
   preparing a second portion of the shielded enclosure having exposed edges of a second set of shielding layers; and
   mating the first and second portions of the shielded enclosure together by aligning the exposed edges of the first and second sets of shielding layers.

2. The microfabrication process of claim 1, wherein etching the shield pattern includes forming a trench in the substrate.

3. The microfabrication process of claim 2, wherein the trench includes a portion having a nonlinear shape.

4. The microfabrication process of claim 1, wherein forming the shielding layers is performed by electrodeposition.

5. The microfabrication process of claim 4, wherein forming the shielding layers includes forming a seed layer on the substrate and in the shield pattern, prior to electrodepositing the shielding layers.

6. The microfabrication process of claim 1, wherein the magnetic layers include a magnetic material.

7. The microfabrication process of claim 1, wherein the magnetic layers include a nickel-iron alloy or a mu-metal.

8. The microfabrication process of claim 1, wherein the spacing layers have a lower permeability relative to the magnetic layers.

9. The microfabrication process of claim 1, wherein the spacing layers include a conductive material.

10. The microfabrication process of claim 1, wherein the spacing layers include a metal or a metal alloy.

11. The microfabrication process of claim 1, further comprising forming an insulating layer at least partially covering the shielding layers.

12. The microfabrication process of claim 1, wherein forming the shielding layers is performed using a robotic plater.

13. The microfabrication process of claim 1, wherein preparing the second portion of the shielding enclosure includes:
    etching the shield pattern into a second substrate;
    forming the second set of shielding layers on the second substrate and in the shield pattern of the second substrate, wherein the second set of shielding layers include n+1 magnetic layers and n spacing layers, and each spacing layer is disposed between a pair of magnetic layers; and
    planarizing the second substrate to expose edges of the second set of shielding layers, yielding the second portion of the shielded enclosure.

14. The microfabrication process of claim 1, further comprising:
    positioning a device between the first portion and the second portion of the shielded enclosure; and
    bonding the first portion and the second portion of the shielded enclosure together.

15. The microfabrication process of claim 1, wherein etching the shield pattern into the substrate includes forming at least one trench in the substrate; and
    wherein forming the set of shielding layers in the shield pattern includes forming a portion of the set of shielding layers in the at least one trench; and
    wherein planarizing the substrate includes exposing the substrate adjacent to the at least one trench while maintaining the portion of the set of shielding layers in the at least one trench.

* * * * *